US006703841B2

(12) United States Patent
Scilla

(10) Patent No.: US 6,703,841 B2
(45) Date of Patent: Mar. 9, 2004

(54) METHOD FOR DETECTING A DISCONTINUITY IN THE ELECTRICAL CONNECTIONS OF A MICROCHIP AND CIRCUIT USING SAID METHOD

(75) Inventor: Giuseppe Scilla, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 33 days.

(21) Appl. No.: 10/153,001

(22) Filed: May 22, 2002

(65) Prior Publication Data

US 2003/0176108 A1 Sep. 18, 2003

(30) Foreign Application Priority Data

May 22, 2001 (IT) .................................... MI2001A1058

(51) Int. Cl.[7] ......................... H01H 31/02; G01R 31/28
(52) U.S. Cl. ........................ 324/537; 324/511; 324/763
(58) Field of Search ................................ 324/537, 511, 324/522, 525, 763, 765, 609, 158.1; 340/651, 652

(56) References Cited

U.S. PATENT DOCUMENTS 5,485,095 A * 1/1996 Bertsch et al. .............. 324/537
6,617,869 B1 * 9/2003 Pillkahn ..................... 324/763

* cited by examiner

*Primary Examiner*—Anjan K. Deb
(74) *Attorney, Agent, or Firm*—Lisa K. Jorgenson; Stephen Bongini; Fleit, Kain, Gibbons, Gutman, Bongini & Bianco P.L.

(57) ABSTRACT

A method is provided for detecting a discontinuity in electrical connections of a microchip that includes an input pin connected to a voltage supply line, multiple circuit sections, an output voltage line for connecting the circuit sections to an output pin, and a resistive output divider. According to the method, there is determined a number of electrical connections as a function of the short circuit current for the input and output pins. The voltage supply line is sectioned as a function of the number of electrical connections determined for the input pin, and the sections of the voltage supply line are connected independently to the circuit sections. The output voltage line is sectioned as a function of the number of electrical connections determined for the output pin. As a function of the number of electrical connections determined, the number and value of the resistances of the output divider is increased.

13 Claims, 2 Drawing Sheets

METHOD FOR DETECTING A DISCONTINUITY IN THE ELECTRICAL CONNECTIONS OF A MICROCHIP AND CIRCUIT USING SAID METHOD

The present invention refers to a method for detecting a discontinuity in the electrical connections of a microchip and circuit using said method.

The present invention in particular refers to a power voltage device, having the means needed for detecting a discontinuity in the electrical connections during an in-package control phase.

The so-called wire bonding technology uses various process typologies and is currently the most common technique used for making electrical interconnections between the semiconductor chip and the printed circuit.

In addition, the wire bonding technology is fundamental for ensuring that the power arrives at the input of the semiconductor chip and that the information is placed on the outputs of the printed circuit.

With reference to FIG. 1, the wire bonding process for a ball bonding type connection comprises a first phase of ball bonding for a first connection pad 1 of a semiconductor chip 2 and a second bonding phase for a second connection pad 3 of a printed circuit 4.

As shown by FIG. 1, after making the first ball bonding phase, a wire 5 is guided by the second connection pad 3 of the printed circuit 4 by means of a capillary 6 to the first connection pad 1.

At the end of the production process the device is submitted to various control and verification tests of the electrical performance and the quality of the electrical connections.

Nevertheless the current test circuits do not detect unequivocally the discontinuities of the connection wires.

In fact, the device can result valid even after the connection wires have been checked in the event that all the electrical parameters characterizing the device itself remain within the minimum and maximum design thresholds.

Normally the discontinuity of the connections happens when resin is injected under pressure in the semiconductor package 2.

As a consequence, when the device is used in working conditions, there are evident reliability problems.

In addition, the number of input and output terminals keeps growing as the density of integration of the integrated devices increases, and this entails a greater risk of discontinuity in the connection wires.

Therefore all this causes an increase in the possible discontinuities in the connection wires leading to a production of less reliable devices.

For example, in the case of power voltage regulator devices, so that they operate well, said power voltage circuit has to be designed as much balanced as possible, so as to improve both the resistance to thermal peaks and the so-called SOA (Safe Operating Area).

To obtain adequate balancing precise resistive ballast and a precise arrangement of the input and output pads has to be adopted.

In fact, in power voltage regulator devices a correct configuration of the input and/output pads has to be observed.

In addition, it has to be remembered that in said devices only one pad is present for one input voltage for a signal, that is Vin pad, and only one pad for an output voltage of a signal, that is Vout.

The current control or test circuits are not capable of selecting devices in package, such as, power voltage regulators, in which one single pad is present, that is, there is only one pin.

In fact it could happen that the device passes the control test even if it has an electrical discontinuity.

In view of the state of the technique described, the object of the present invention is to supply a method that is capable of preventing a device from being claimed definitely valid after a reliability test.

A further purpose of the present invention is to make a circuit that is capable of unequivocally identifying the electrical discontinuity.

According to the present invention, said object is reached by means of a method for detecting a discontinuity in the electrical connections of a microchip comprising a voltage supply line, a plurality of circuit sections of said printed circuit, an input pin connected to said voltage supply line, an output voltage line, able to connect said plurality of circuit sections to an output pin and a resistive divider made up of a plurality of resistances, characterized in that it comprises the following succession of steps: a) to determine the number of connections in function of the short circuit current both for said input pin and for said output pin; b) to section said voltage supply line in function of the number of the electrical connections determined at point (a) for said input pin; c) to connect the sections of said voltage supply line independently, by means of a plurality of connection wires, with a respective plurality of sections of said printed circuit; d) to section an output voltage line in function of the number of electrical connections determined at point (a) for said output pin; e) to increase in function of the number of electrical connections determined at point (a) the number and the value of the resistances constituting said output divider.

This purpose is also reached by means of a power voltage circuit comprising a voltage supply line, able to supply a plurality of circuit sections of said printed circuit, an input pin connected to said voltage supply line, an output voltage line, able to connect said plurality of circuit sections to an output pin and a resistive divider made up of a plurality of resistances, characterized in that it comprises an equal plurality of connection wires, between said input pin and said circuit sections and between said output pin and said circuit sections.

Thanks to the present invention a method can be made by means of which there is no longer any uncertainty regarding the reliability of the device checked.

Thanks to the present invention a power voltage device can be made which is capable of unequivocally detecting the presence of a discontinuity in the electrical connections.

The characteristics and the advantages of the present invention will appear evident from the following detailed description of an embodiment thereof, illustrated as non-limiting example in the enclosed drawings, in which.

Figure 1:
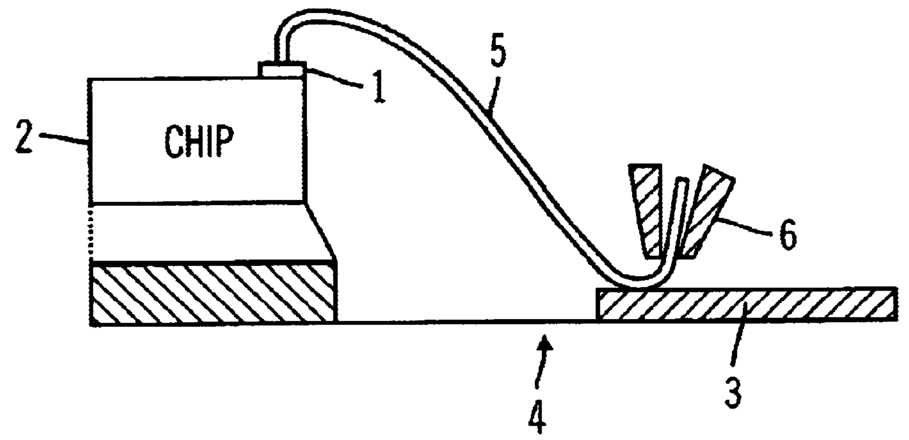
FIG. 1 shows a wire bonding process according to the known technique.
Figure 2:
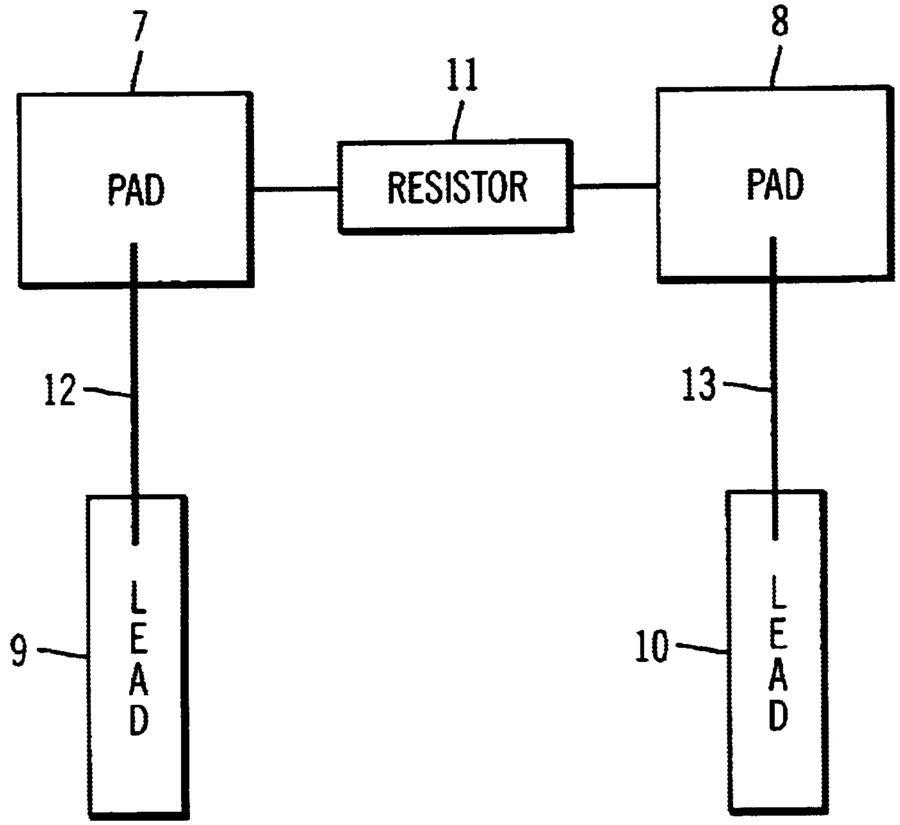
FIG. 2 shows a circuit for detecting electrical discontinuity according to the known technique.

A circuit for detecting the electrical discontinuity according to the known technique is shown in FIG. 2 in which it can be seen that for each pad 7 and 8 of a power device is connected, respectively, to a lead 9 and 10 by means of a respective connecting wire 12 and 13. A resistance 11 placed between said two pads 7 and 8 can also be noted.

Such a configuration is designed for multipad and multilead type devices.

With such a configuration, then, it is easy to identify a lack on connection between the pads 7 and 8 when an in-package control test is carried out.

In fact, a discontinuity of a wire can be detected by means of inserting the resistance 11 between the two pads 7 and 8.

Therefore, if there is a discontinuity of a wire when the electrical characteristics of the circuit are controlled in package, a strong resistive value is not detected and this indicates that one of the two connecting wires 12 or 13 is disconnected.

Nevertheless the technique shown in FIG. 2 cannot be used for voltage regulator devices in which a correct configuration of the pins has to be observed and where there is only one Vin pin and only one Vout pin.

As previously described in the case of the power voltage regulators, in order to obtain high quality production standards, a circuit is indispensable which is able to determine unequivocally, by carrying out an in package test or a verification, that there is a discontinuity of an electrical connection.

Figure 3:
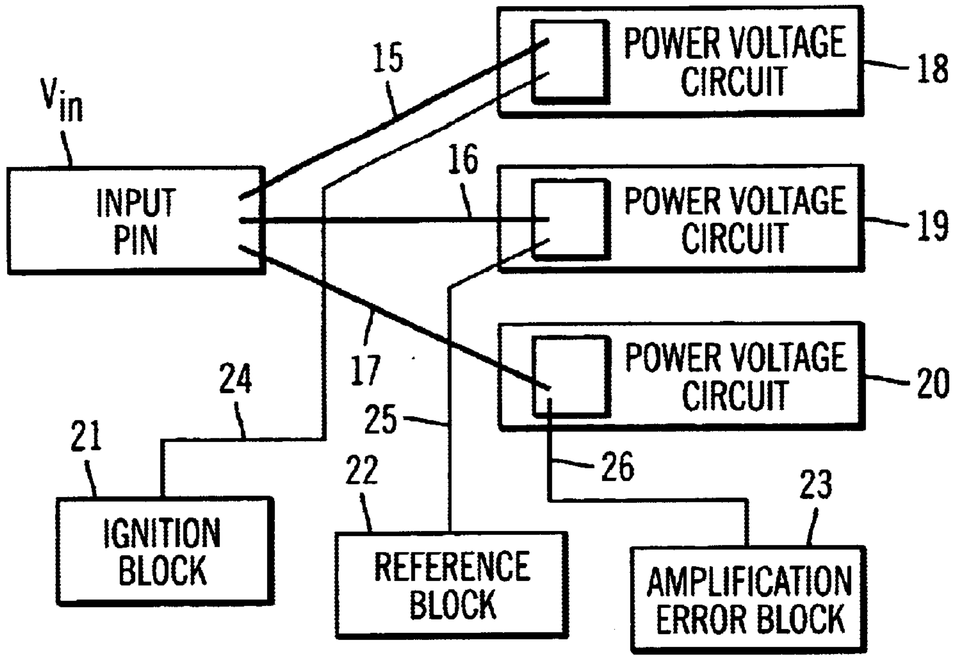
FIG. 3 shows a circuit for detecting the electrical discontinuity for an input supply line according to the present invention.

In FIG. 3 a circuit for detecting the electrical discontinuity according to the present invention is shown.

According to what is illustrated in said figure it can be seen that there is a pin of an input Vin signal that is connected independently by means of a plurality of connection wires 15, 16 and 17 with respective sections 18, 19 and 20 of the power voltage circuit.

Each of these sections 18, 19 and 20 is in turn connected with a power block 21, 22 and 23 of the power voltage circuit by means of plurality of connection wires 24, 25 and 26.

For example, in the specific embodiment of FIG. 3, the supply line is sectioned in three separate lines 15, 16 and 17 in which each of the lines 15, 16 and 17 supplies a section of the circuit 18, 19 and 20.

In other words the supply line Valim is sectioned, made for example with a metal track within the microchip, in a well-defined number, as explained below.

The circuit sections 18, 19 and 20 are in turn connected, for example, with an ignition block 21, a reference block 22 and an amplification error block 23, that is with blocks of fundamental importance for the operation of the voltage regulator device.

Therefore, connected to the input pin Vin, is a plurality of blocks vital for the operation of the voltage regulator device, so that the in-package test is carried out on the blocks that are vital for said device.

Therefore, if only one of the connection wires 24, 25 and 26 is missing, the test circuit will give a negative result and therefore the device will be rejected because faulty.

Therefore so that it is possible to reach a similar result, during the layout designing phase, whether the power voltage device is implemented by means of bipolar power or by means of p-type MOS transistors, first of all the number of electrical connections has to be determined in function of the short circuit current both for the Vin input signal pin and for the Vout output signal.

The number of electrical connections in function of the short circuit current is calculated on the basis of the value of said short circuit current and in combination with the maximum quantity of current that can be supported by a single bonding wire.

Successively the supply line has to be split so as to supply separately all the fundamental sections of the power voltage circuit.

Figure 4:
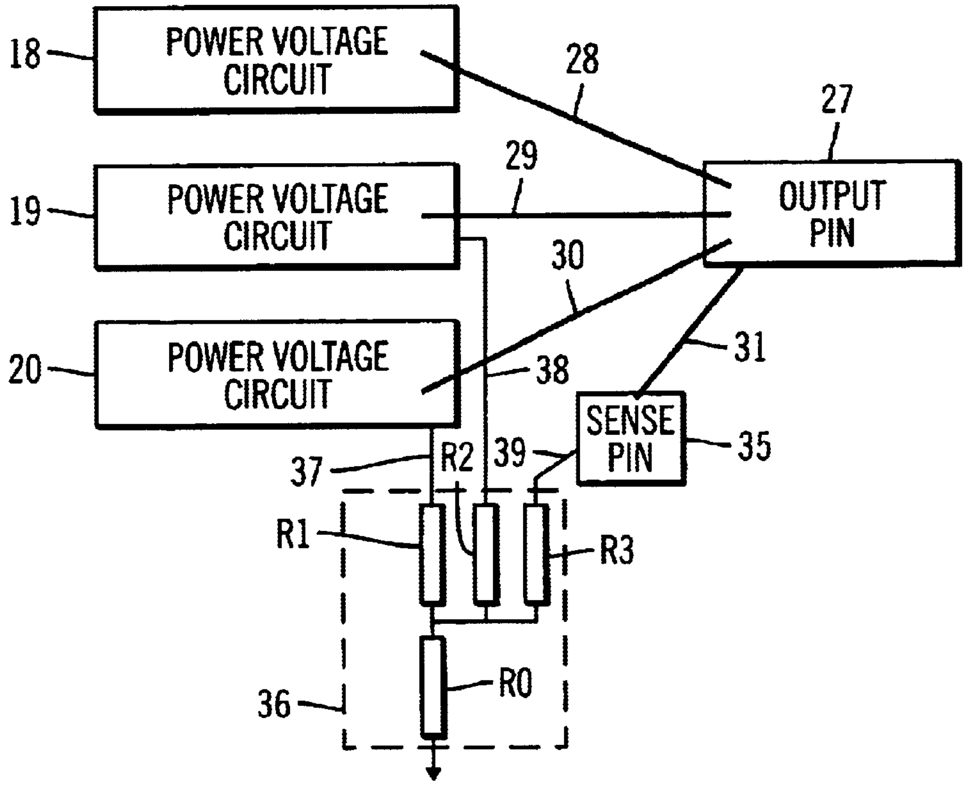
FIG. 4 shows a circuit for detecting the electrical discontinuity for an output line according to the present invention.

On the basis of the number of the sections into which the supply line is split, the output line has to be split, as described in FIG. 4.

In fact, a circuit for detecting the electrical discontinuity for an output line according to the present invention is shown in FIG. 4.

According to what is illustrated in said Figure it can be noted that at the output pin 27, called Vout, a plurality of connection wires 28, 29, 30 and 31 are connected.

Said connection wires 28, 29, 30 connect the same plurality of circuit sections 18, 19 and 20 illustrated previously in FIG. 3, with in addition the presence of another connecting wire 31 suited to connecting a so-called sense pin 35, only present in the output circuitry of the power voltage device.

Each section 18, 19, 20 and 35 of the power voltage circuit is connected by means of a respective plurality of connecting wires 37, 38 and 39 to a resistive divider 36 connected to ground.

The resistive divider is composed of a plurality of resistances R0, R1, R2 and R3, which are in number, and value function of the number of sections in which the supply line is split.

In the particular embodiment illustrated in FIG. 4, it can be seen that similarly to what is obtained with the input supply line, in output the output divider 36 has to be tripled, as the output connection wires 28, 29 and 30 must be equal in number to the input connection wires 15, 16 and 17 to be able to observe the correct balance of the power voltage device.

The configuration of the divider is such that the resistances R1 and R2 have a lead connected to the respective circuit sections 20 and 19 and the resistance R3 to the sense pin 35, while the other lead of said resistances R1, R2 and R3 is in common and connected to the resistance R0, which in turn possesses the other lead connected to ground.

Therefore the resistive divider must be made so that the ratio between one of the resistances R1, R2 and R3 directly connected to the sections 19, 20 and 35 and the resistance R0, grounded directly, must be such that said resistive ratio remains constant.

Nevertheless the value and the number of the resistances must be increased in function of the number of the connection wires 15, 16 and 17 or similarly 28, 29 and 30.

For example, as is well known by a technician of the sector, if the drop in voltage on the R0 is for example Vref=1,25 V, as R0 is the resistance able to produce the reference voltage Vref within the microchip, to obtain an output voltage, for example equal to Vout=2,5 V, only one resistance must be put between the reference resistance R0 and the output terminal.

In other words one single resistance R1 must be inserted, such that R0=R1, to obtain Vout=2,5 V, that is it must be:

$$Vout=(Vref/R0)*R1$$

Obviously, to obtain the same output voltage Vout=2,5 V, making reference to the circuit shown in FIG. 4, having, that is, the resistances R1, R2 and R3, is as if the resistance between the reference resistance and the output terminal was tripled. Such a parallel has to be used that:

$$Vout=(Vref/R0)*Req$$

where with Req we intend the parallel between the resistances R1, R2 and R3.

If this were not the case we would have a breakage of the power voltage device caused by the unbalancing that the current would undergo.

The device 35 is a so-called sense pin, which in this case provides for only one section of the supply line, but also said sense pin 35 can be multiplied on the basis of the characteristics of the load of the power voltage device.

Also in this configuration only one connecting wire 28 or 29 or 30 has to be disconnected for the power device not to pass the test.

The previously described method and circuits do not depend on the type of device used to implement the power voltage circuit, that is the inventive idea regardless of the type of power used, whether it be bipolar power or p-type MOS transistors.

What is claimed is:

1. A method for detecting a discontinuity in electrical connections of a microchip, the microchip including a voltage supply line, an input pin connected to the voltage supply line, a plurality of circuit sections of a circuit, an output pin, an output voltage line for connecting the plurality of circuit sections to the output pin, and a resistive output divider including a plurality of resistances, said method compromising the steps of:

determining a number of electrical connections as a function of the short circuit current both for the input pin and for the output pin;

sectioning the voltage supply line as a function of the number of electrical connections that was determined for the input pin;

connecting the sections of the voltage supply line independently, through a plurality of connection wires, to the plurality of circuit sections;

sectioning the output voltage line as a function of the number of electrical connections that was determined for the output pin; and increasing, as a function of the number of electrical connections that was determined for the output pin, the number and value of the resistances of the output divider.

2. A power voltage circuit comprising:

a plurality of circuit sections of the circuit;

a voltage supply line for supplying the plurality of circuit sections;

an input pin connected to the voltage supply line;

an output pin;

an output voltage line for connecting the plurality of circuit sections to the output pin;

a resistive output divider including a plurality of resistances; and a plurality of connection wires between the input pin and the circuit sections and an equal plurality of connection wires between the output pin and the circuit sections.

3. The power voltage circuit according to claim 2, wherein the resistive output divider includes a plurality of first resistances each having one lead connected to one of the circuit sections and its other lead commonly connected to one lead of a second resistance, which has its other lead connected to ground.

4. The power voltage circuit according to claim 3, wherein the resistive output divider performs a resistive division that is increased by a value equal to the number of the connection wires between the input pin and the circuit sections.

5. The power voltage circuit according to claim 4, wherein the resistive output divider is constant in value.

6. The power voltage circuit according to claim 3, further comprising a sense pin is connected on one side to the output pin and on the other side to one of the first resistances.

7. The power voltage circuit according to claim 2, wherein the circuit sections are connected to a plurality of blocks through another plurality of connection wires.

8. An apparatus including at least one power voltage circuit, said power voltage circuit comprising:

a plurality of circuit sections of the circuit;

a voltage supply line for supplying the plurality of circuit sections;

an input pin connected to the voltage supply line;

an output pin;

an output voltage line for connecting the plurality of circuit sections to the output pin;

a resistive output divider including a plurality of resistances; and a plurality of correction wires between the input pin and the circuit sections and an equal plurality of connection wires between the output pin and the circuit sections.

9. The apparatus according to claim 8, wherein the resistive output divider of the power voltage circuit includes a plurality of first resistances each having one lead connected to one of the circuit sections and its other lead commonly connected to one lead of a second resistance, which has its other lead connected to ground.

10. The apparatus according to claim 9, wherein the resistive output divider of the power voltage circuit performs a resistive division that is increased by a value equal to the number of the connection wires between the input pin and the circuit sections.

11. The apparatus according to claim 10, wherein the resistive output divider of the power voltage circuit is constant in value.

12. The apparatus according to claim 9, wherein the power voltage circuit further comprises a sense pin that is connected on one side to the output pin and on the other side to one of the first resistances.

13. The apparatus according to claim 8, wherein the circuit sections of the power voltage circuit are connected to a plurality of blocks through another plurality of connection wires.

* * * * *